(12) United States Patent
Platt et al.

(10) Patent No.: US 8,130,155 B2
(45) Date of Patent: Mar. 6, 2012

(54) MARINE MULTIBAND ANTENNA

(75) Inventors: John Jeremy Churchill Platt, Grand Haven, MI (US); Paul A. Bogdans, Grand Haven, MI (US)

(73) Assignee: R.A. Miller Industries, Inc., Grand Haven, MI (US)

( * ) Notice: Subject to any disclaimer, the term of this patent is extended or adjusted under 35 U.S.C. 154(b) by 397 days.

(21) Appl. No.: 12/470,306

(22) Filed: May 21, 2009

(65) Prior Publication Data

US 2010/0013723 A1    Jan. 21, 2010

Related U.S. Application Data

(60) Provisional application No. 61/081,244, filed on Jul. 16, 2008.

(51) Int. Cl.
*H01Q 1/32* (2006.01)

(52) U.S. Cl. .......................................... 343/709

(58) Field of Classification Search .................. 343/709, 343/702, 713, 872, 890, 873
See application file for complete search history.

(56) References Cited

U.S. PATENT DOCUMENTS

| 4,694,773 | A | * | 9/1987 | Sparkes et al. ................ 114/354 |
| 5,734,352 | A | | 3/1998 | Seward et al. |
| 6,107,972 | A | * | 8/2000 | Seward et al. ................ 343/722 |
| 6,125,782 | A | * | 10/2000 | Takashima et al. ........... 114/343 |
| 6,269,763 | B1 | * | 8/2001 | Woodland ..................... 114/382 |
| 6,927,743 | B1 | | 8/2005 | Miller et al. |

FOREIGN PATENT DOCUMENTS

| EP | 1187253 A1 | 3/2002 |
| EP | 1471599 A1 | 10/2004 |

* cited by examiner

*Primary Examiner* — Huedung Mancuso
(74) *Attorney, Agent, or Firm* — McGarry Bair PC

(57) ABSTRACT

A marine multiband antenna array includes a nearly virtual bow tie UHF antenna and a connected VHF/FM antenna that together function as an AM antenna. A diplexer separates the AM/FM radio signals from the UHF/VHF television signals.

9 Claims, 8 Drawing Sheets

MARINE MULTIBAND ANTENNA

This application claims priority on U.S. Provisional Patent Application No. 61/081,244, filed Jul. 16, 2008, incorporated herein by reference.

BACKGROUND OF THE INVENTION

1. Field of the Invention

The invention relates to antennas and more particularly to marine antennas.

2. Description of the Related Art

Contoured antennas for boats that improve appearance are known. See, for example, U.S. Pat. No. 6,927,743, commonly assigned. Multiband antennas that resonate well in different frequency ranges are also known. See, for example, U.S. Pat. No. 5,734,352, commonly owned.

TV reception for a boat is typically optimized in a horizontal loop antenna of the type made and sold by Glomex of Ravenna, Italy. For example, the Glomex model V9130 antenna comprises horizontal loops in a semi-spherical housing with a reception angle of 60°. The Glomex model V9112 antenna has three horizontal loops in a saucer-shaped housing. Although promoted as being omni-directional, gain patterns of the Glomex antennas show nulls that effectively make them directional, requiring rotation to obtain the best reception. Moreover, both antennas further require an amplifier to boost the signal from the radiator since the amplifier is designed for a power range of only about 12V. A problem with amplifying the signal from such an antenna is that it also amplifies noise and results in less than optimal reception.

There is a need for a more robust multiband marine antenna that can accommodate VHF and UHF frequency ranges without an amplifier and also resonate at other useful frequencies such as AM/FM radio, all packaged in a single antenna housing of the type disclosed in the '743 patent.

SUMMARY OF THE INVENTION

According to the invention, a marine multiband antenna assembly includes a base plate adapted to function as a ground plane and an antenna extending normally from the base plate. The antenna comprises a lower portion connected to the base plate and configured to resonate in the UHF band and an upper portion extending from the lower portion and configured to resonate in the FM and VHF frequency ranges. The lower portion comprises a printed circuit board mounted normal to the base plate. A triangular radiator is disposed on the printed circuit board and adapted to function as one half of a bow tie antenna for reception in the UHF band. When the antenna assembly is mounted to a marine vessel, it can receive signals in the AM, FM, VHF, and UHF frequency ranges in a single self-contained enclosure. In another aspect of the invention, a diplexer for a marine multiband antenna includes an input adapted to connect to a marine multiband antenna, a signal splitter connected to the input for splitting signals from the antenna into two sides, an FM blocking circuit on one side adapted to block signals in the FM frequency range and a capacitor in series with the FM blocking circuit sized to block signals in the AM frequency range wherein the resulting signal is adapted to be received by a conventional TV receiver, and a first inductor connected in series to a second conductor and a capacitor in parallel sized to pass signals in the AM and FM frequency ranges wherein the resulting signal is adapted to be received by a conventional AM/FM receiver.

DETAILED DESCRIPTION OF THE INVENTION

Figure 1:
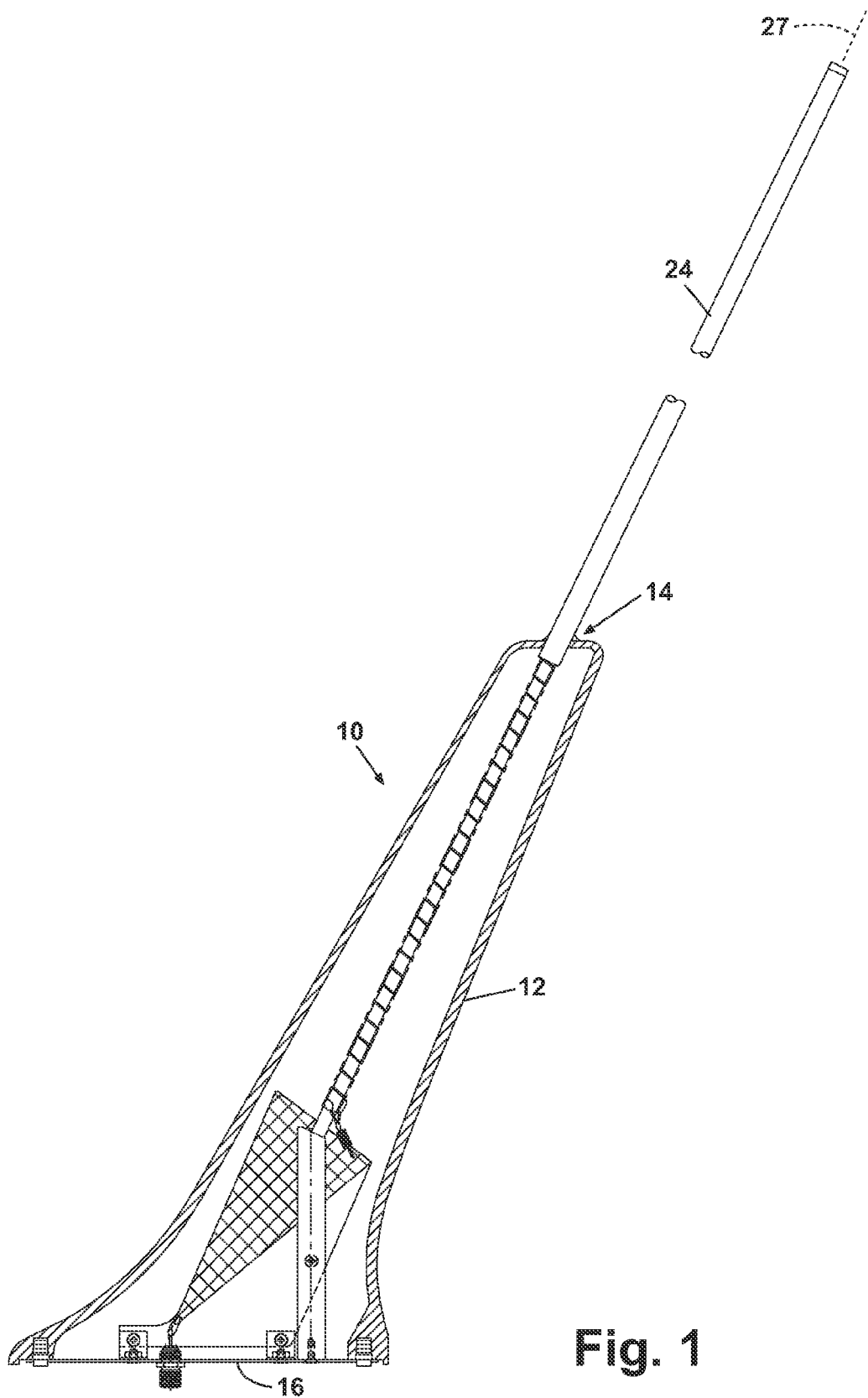
FIG. 1 is a sectional view in elevation of a marine housing incorporating a multiband antenna according to the invention.
Figure 6:
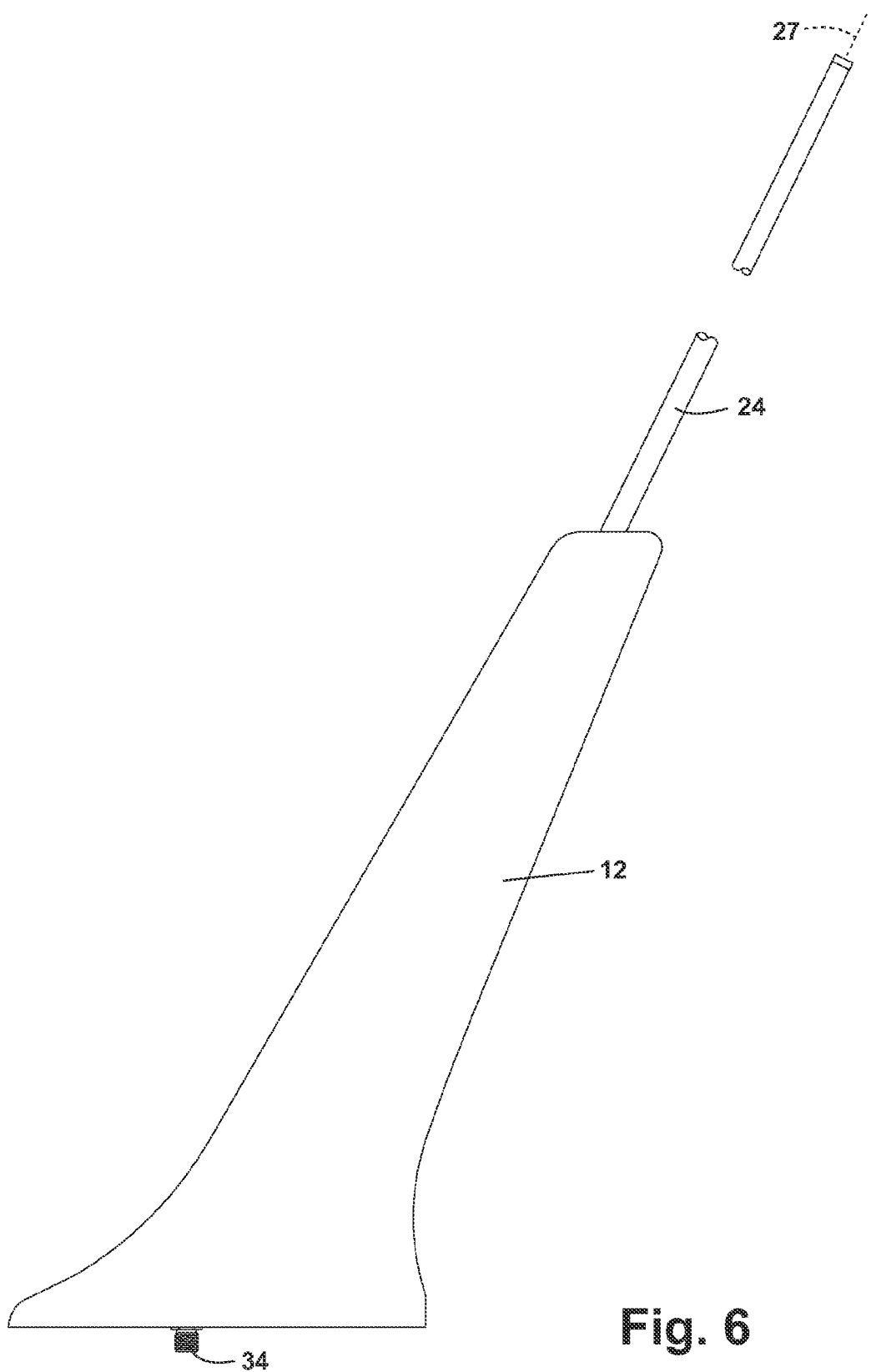
FIG. 6 is a side view of the housing and antenna of FIG. 1.
Figure 7:
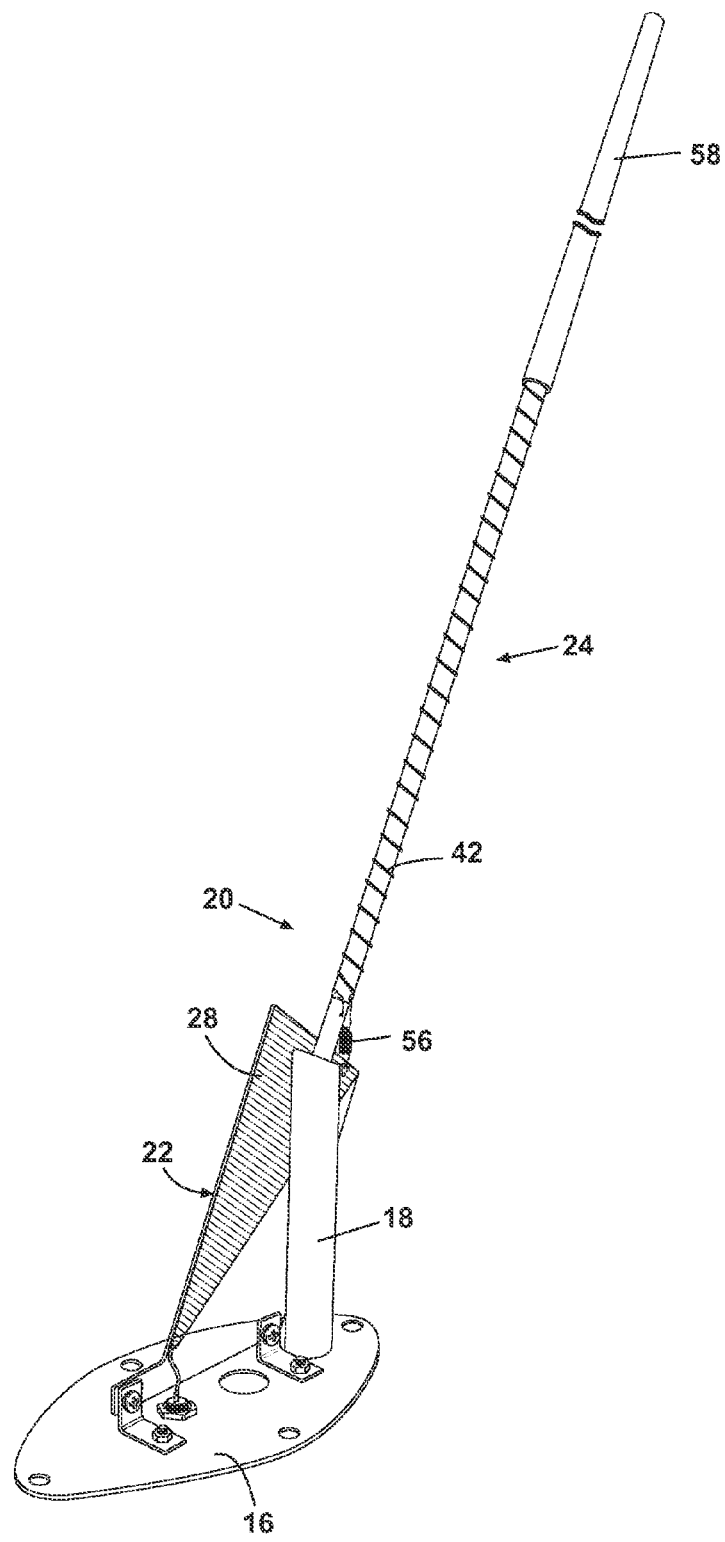
FIG. 7 is a perspective view of the antenna of FIG. 2.

FIGS. 1 and 6 show a contoured antenna assembly 10 comprising a cowling 12 and an antenna assembly 14 according to the invention. The cowling 12 will preferably be of a construction such as that disclosed in U.S. Pat. No. 6,927,743, the entire disclosure of which is incorporated herein by reference.

Figure 2:
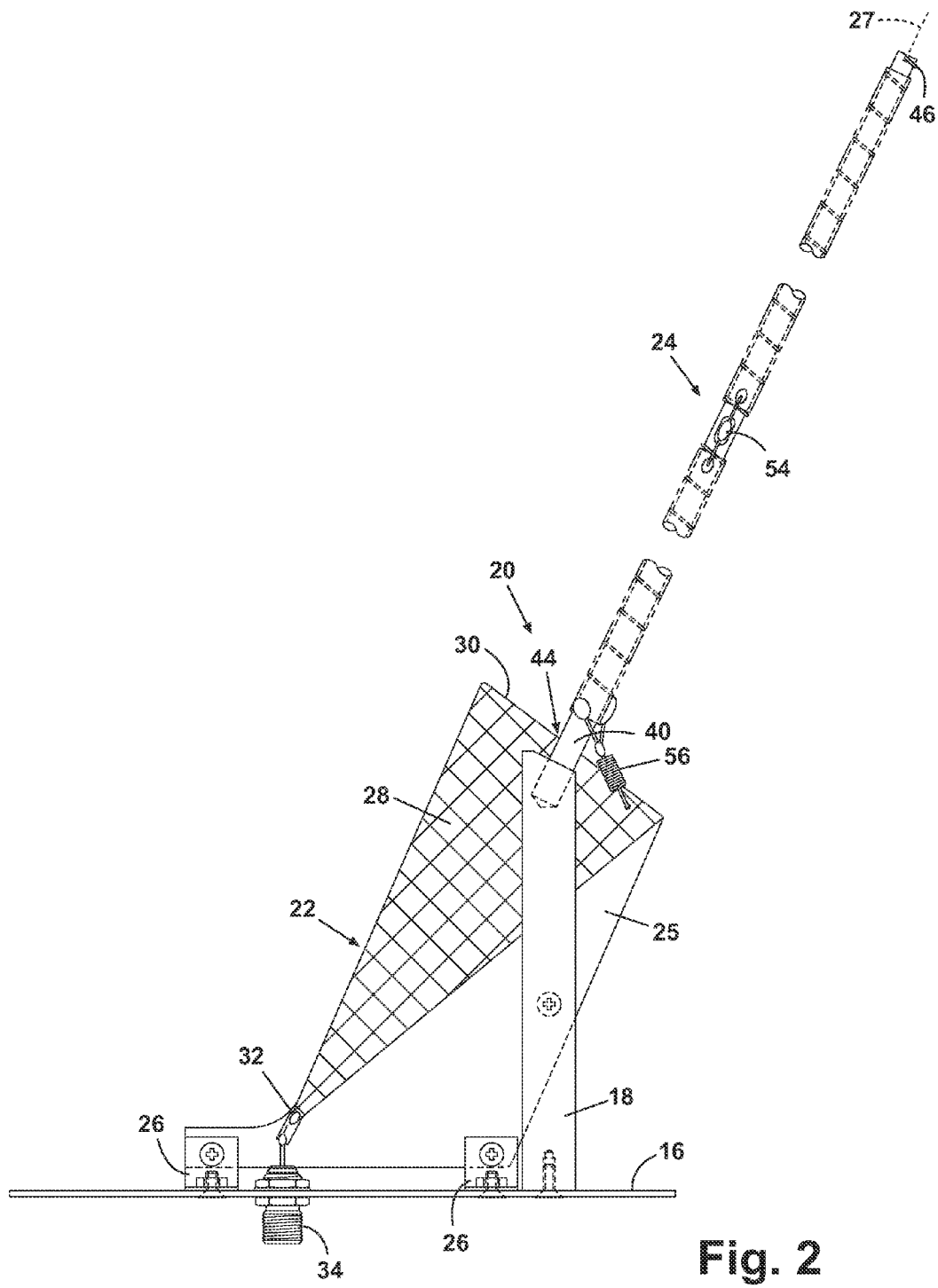
FIG. 2 is an expanded side view of the antenna according to the invention.

Looking now also at FIG. 2, the antenna assembly 14 comprises a base plate 16 on which is mounted a vertically extending stanchion 18. An antenna 20 comprises a lower portion 22 and a whip portion 24. The lower portion 22 comprises a printed circuit board 25 vertically mounted to the base 16 by brackets 26 and, preferably, secured to the stanchion 18. A flat triangular radiator 28 is disposed on a printed circuit board 25 and is adapted to function as one half of a bow tie antenna for reception in the UHF TV band. The triangular radiator 28 is preferably in the form of an isosceles triangle with a base 30 at an upper edge of the printed circuit board 25 and a vertex 32 facing toward the base plate 16. To enhance signals in the UHF band, the triangular radiator 28 is preferably disposed such that the longitudinal axis extending from the vertex 32 to the base 30 is disposed approximately at a 25° angle relative to the vertical, thereby providing a horizontal complement to the bow tie. The vertex 32 is electrically connected to a coaxial connector 34 extending through the base plate 16.

The whip portion 24 extends at a longitudinal axis 27 from the end of the stanchion 18. The longitudinal axis 27 is preferably not normal to the base plate 16, and the rake angle of the whip portion is mostly ornamental, offering an appearance of speed.

Figure 4:
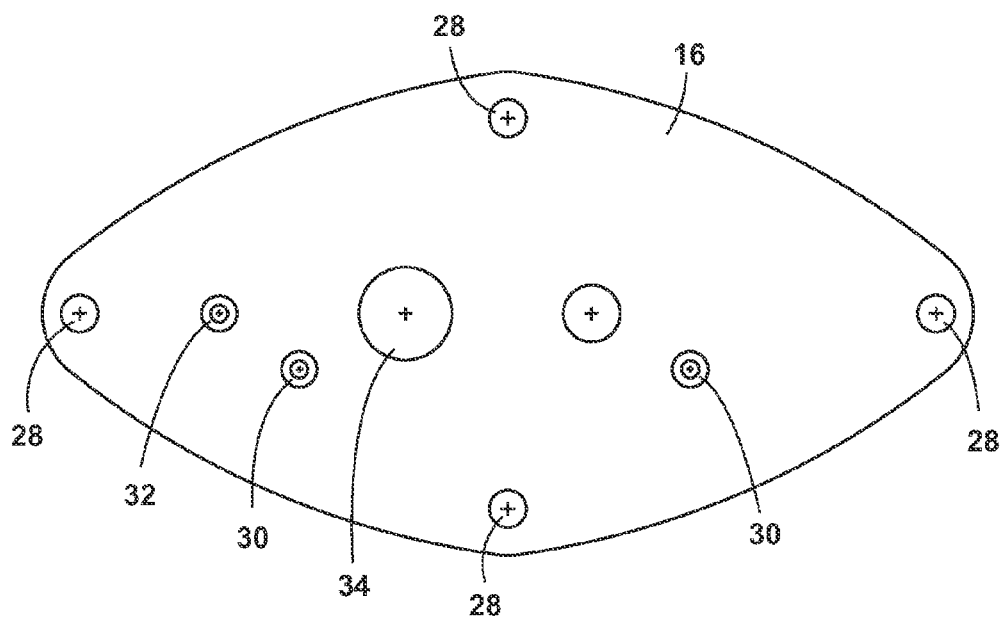
FIG. 4 is plan view of the base of the antenna of FIG. 2.

Looking again at FIG. 1 and also at FIGS. 4 and 6, it will be understood that the cowling 12 is secured to the base plate 16. The whip portion 24 projects through the cowling 12, generally along the longitudinal axis 27. The base plate 16 comprises a plurality of fasteners 28 to mount the cowling 12. Two apertures 30 are provided to secure the brackets 26, and another aperture 32 is provided to mount the stanchion 18. Yet a third aperture 34 is provided to secure the coaxial connector 34.

Figure 3:
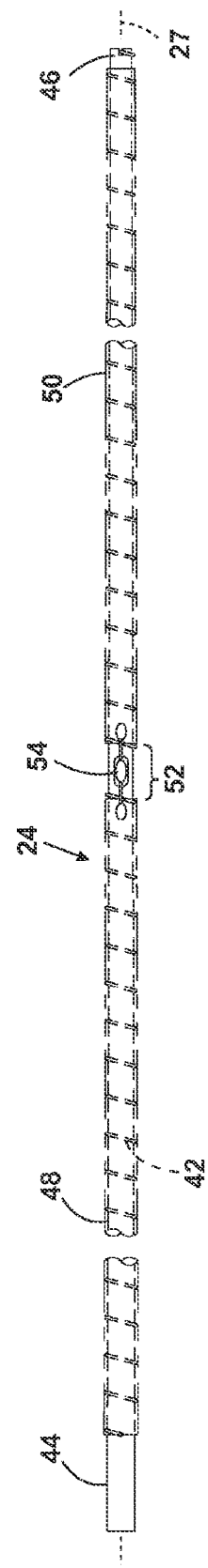
FIG. 3 is side view of the whip portion of the antenna of FIG. 2.
Figure 8:
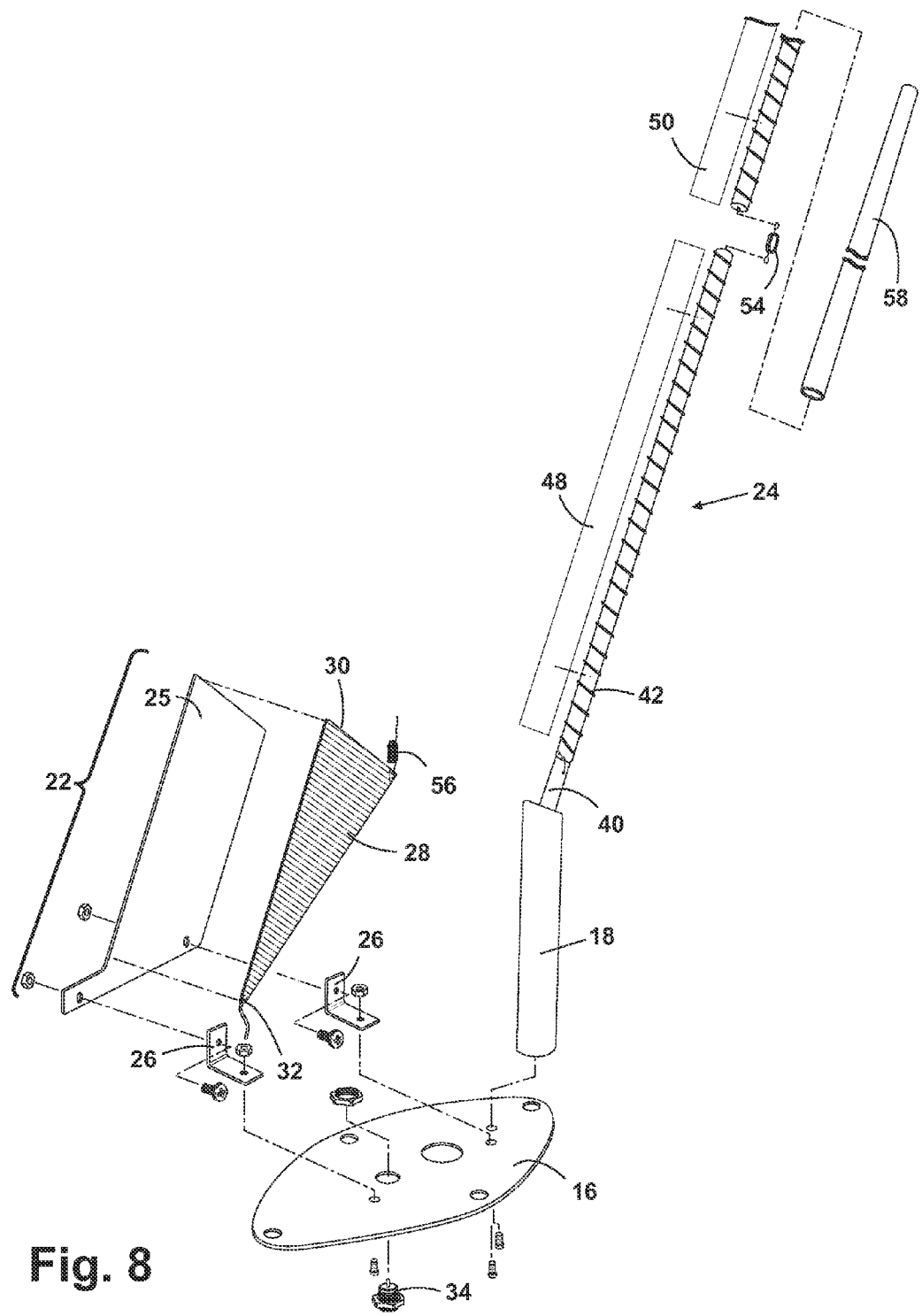
FIG. 8 is an exploded view of the antenna of FIG. 7.

Looking now at FIGS. 2, 3, and 8, it can be seen that the whip portion 24 comprises an elongated dielectric core 40, preferably made of fiber glass. An insulated copper wire 42 is wrapped helically around the core from near the proximal end 44 at the stanchion 18 to the distal end 46. A first section 48 of copper foil tape is wrapped over the insulated wire on the whip near the proximal end 44, and a second section 50 of copper foil tape is wrapped over the insulated wire on the whip portion near the distal end 46. The first and second sections 48, 50, are spaced from each other at a gap 52. A disc capacitor 54 is disposed in a gap 52 and electrically wired to the first and second sections 48, 50 across the gap. The end of the insulated copper wire 42 at the distal end 46 is electrically connected to the second section 50, and the end of the insulated copper wire at the proximal end 44 is electrically connected to the first section 48. Finally, an inductive coil 56 is wired between the first section 48 and the flat triangular radiator 28. A protective fiberglass sleeve 58 can be provided for that part of the whip portion 24 that extends outwardly of the cowling 12.

With this structure it can be seen that the antenna 20 is nondirectional and limited in length. It is virtually identical in appearance to a conventional VHF marine communications antenna. Yet it can accommodate the very large frequency range of AM, FM, and television signals (0.55 to 700 MHz). The AM band (0.55-1.65 MHz) is captured by the total length of the antenna 20 from the ground plane at the base plate 16 through the flat triangular radiator 28, the inductor 56, the insulated copper wire 42 and the second section 50 of the copper foil. The UHF band (470-700 MHz) is captured by the triangular radiator 28 and trapped by the inductive coil 56. The VHF band (54-88, and 174-216 MHz), and the FM band (88-108 MHz) are captured by the whip portion 24 and the triangular radiator 28. The first and second sections of copper foil sleeves 48, 50 provide effective broad banding within the VHF ranges. The disc capacitor 54 aids in receiving the middle VHF band at 174-216 MHz, and avoids shorting the insulated copper wire 42. To enhance reception in the VHF band, an additional wire can be connected at the base plate or ferrite beads can be provided on a feed line coaxial cable at approximately a one quarter wavelength in the FM band, or the ground plane can be extended by the addition of a larger horizontal plate.

Figure 5:
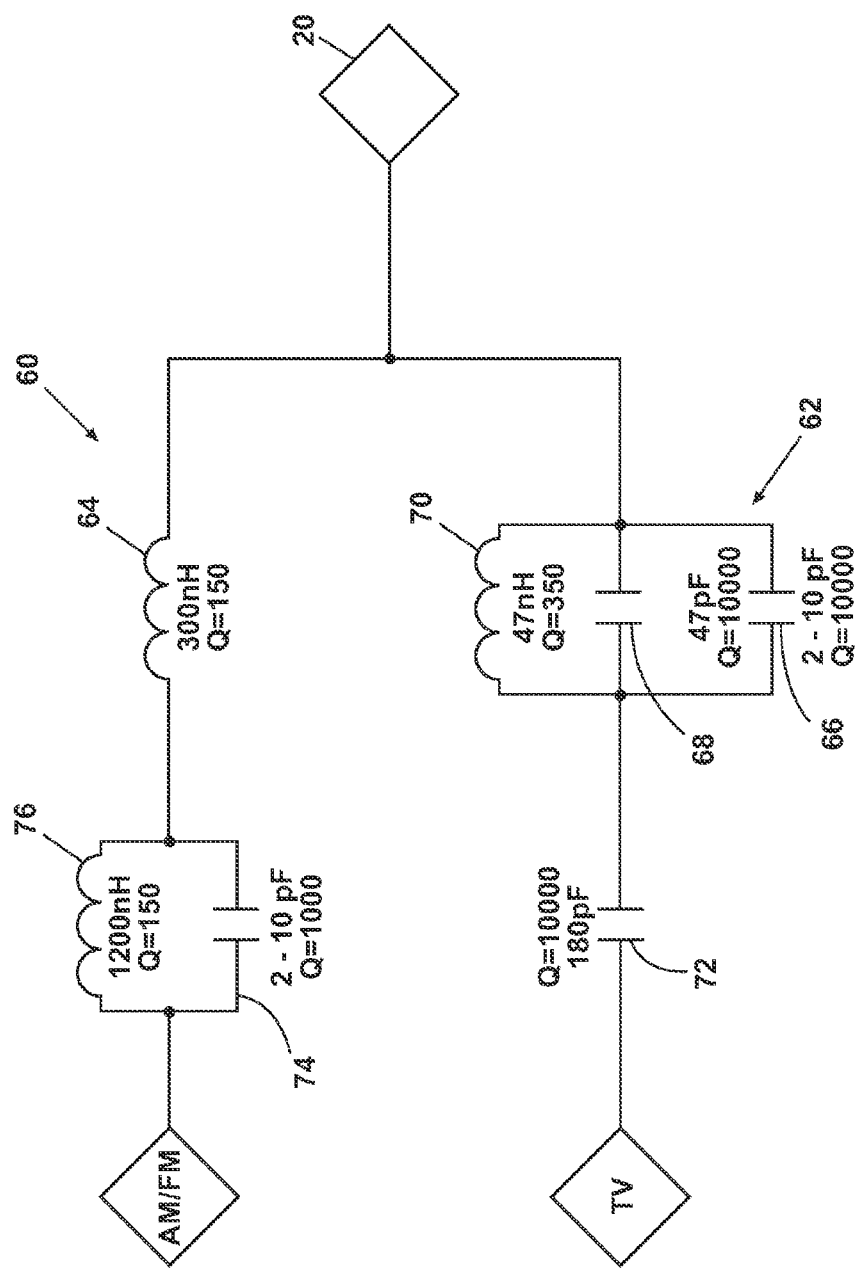
FIG. 5 is a schematic view of the circuit in a diplexer for use with the antenna of FIG. 2 to separate signals.

If only FM and TV signals were desired from the antenna, it would be conventional to incorporate a notch or bandpass filter to separate the FM frequencies from the middle of the TV frequency range. But where AM signals are also desired, a conventional bandpass filter will not work. The solution can be found in the diplexer circuit 60 according to the invention in FIG. 5. Signals from the antenna 20 are split and sent on one side to an FM blocking circuit 62 and on the other side to an inductor 64. The FM blocking circuit 62 comprises first and second capacitors 66, 68 in parallel, and an inductor 70 in parallel with the capacitors. The remaining signal from the FM blocking circuit 62 passes through a capacitor 72 sized to block signals in the AM frequency range. The remaining signals are in the UHF and VHF TV frequency bands to be picked up by a conventional TV receiver. On the other side of the split the signal leaving the inductor 64 is sent to a capacitor 74 and another inductor 76 in parallel to work together to pass the AM and FM signals to be picked up by a conventional AM/FM receiver.

While the invention has been specifically described in connection with certain specific embodiments thereof, it is to be understood that this is by way of illustration and not of limitation, and the scope of the appended claims should be construed as broadly as the prior art will permit.

What is claimed is:

1. A marine multiband antenna assembly comprising:
    a base plate adapted to function as a ground plane;
    an antenna extending normally from the base plate wherein the antenna comprises a lower portion mounted to the base plate and configured to resonate in the UHF band and an upper portion extending from the lower portion, configured to resonate in the FM band, and wherein the lower and upper portions are configured to resonate in the AM and VHF frequency ranges, and wherein the lower portion comprises a printed circuit board mounted normal to the base plate; and
    a triangular radiator disposed on the printed circuit board and adapted to function as one half of a bow tie antenna for reception in the UHF band,
    whereby when the antenna assembly is mounted to a marine vessel, it can receive signals in the AM, FM, VHF, and UHF frequency ranges in a single self-contained enclosure.

2. The marine multiband antenna assembly of claim 1 further comprising a cowling secured to the base plate, sized and dimensioned to house the lower portion, and having an opening through which the upper portion extends.

3. The marine multiband antenna assembly of claim 1 wherein the axis of the triangular radiator is disposed approximately at a 25° angle relative to an axis perpendicular to the base plate.

4. The marine multiband antenna assembly of claim 1 wherein the upper portion comprises a whip portion operably coupled with the triangular radiator.

5. The marine multiband antenna assembly of claim 4 further comprising a stanchion mounted to the base plate from which the whip portion extends and to which the printed circuit board may be secured.

6. The marine multiband antenna assembly of claim 1 wherein the upper portion comprises:
    an elongated dielectric core;
    an insulated copper wire wrapped helically around the core;
    a first section of copper foil tape and a second section of copper foil tape spaced from each other and surrounding the elongated dielectric core; and
    a capacitor electrically connecting the first and second sections of copper foil tape.

7. The marine multiband antenna assembly of claim 6 wherein the upper portion further comprises an inductive coil connecting the first copper foil tape section and the triangular radiator.

8. The marine multiband antenna assembly of claim 7 further comprising a fiberglass sleeve encasing the upper portion.

9. A diplexer for separating signals from a single marine multiband antenna, the diplexer comprising:
    an input adapted to connect to a marine multiband antenna;
    a signal splitter connected to the input for splitting signals from the antenna into first and second sides;
    an FM blocking circuit on the first side adapted to block signals in the FM frequency range, and a capacitor in series with the FM blocking circuit sized to block signals in the AM frequency range, wherein the resulting signal is adapted to be received by a conventional TV receiver; and
    a first inductor on the second side, connected in series to a second conductor and a parallel capacitor, sized to pass signals in the AM and FM frequency ranges wherein the resulting signal is adapted to be received by a conventional AM/FM receiver.

* * * * *